US012662905B1

(12) United States Patent　(10) Patent No.: US 12,662,905 B1
Shammari　(45) Date of Patent: Jun. 23, 2026

(54) METHOD FOR SIMULTANEOUSLY COMBINING A PRODUCTION NETWORK AND AN INJECTION NETWORK WITHIN A SINGLE WORKFLOW

(71) Applicant: Schlumberger Technology Corporation, Sugar Land, TX (US)

(72) Inventor: Ahmad Shammari, Lysaker (NO)

(73) Assignee: Schlumberger Technology Corporation, Sugar Land, TX (US)

( * ) Notice: Subject to any disclaimer, the term of this patent is extended or adjusted under 35 U.S.C. 154(b) by 0 days.

(21) Appl. No.: 19/085,064

(22) Filed: Mar. 20, 2025

(51) Int. Cl.
　*E21B 41/00*　(2006.01)
　*E21B 47/00*　(2012.01)
　*G06F 30/28*　(2020.01)
(52) U.S. Cl.
　CPC .............. *E21B 41/00* (2013.01); *E21B 47/00* (2013.01); *G06F 30/28* (2020.01); *E21B 2200/20* (2020.05)
(58) Field of Classification Search
　CPC ...... E21B 47/00; E21B 41/00; E21B 2200/20; E21B 21/08
　See application file for complete search history.

(56) References Cited

U.S. PATENT DOCUMENTS

| | | | | |
|---|---|---|---|---|
| 10,311,173 | B2 * | 6/2019 | Havre | ..................... G06F 30/18 |
| 10,423,431 | B2 * | 9/2019 | Pecher | ................... G06Q 50/02 |
| 10,810,330 | B2 | 10/2020 | Early | |
| 2014/0172382 | A1 * | 6/2014 | Andrews | ................... F17D 5/00 |
| | | | | 703/2 |
| 2016/0098502 | A1 | 4/2016 | Havre | |
| 2016/0154907 | A1 * | 6/2016 | Halabe | ................. G06Q 10/063 |
| | | | | 703/7 |
| 2016/0275217 | A1 * | 9/2016 | Boneti | ..................... G06F 30/20 |
| 2021/0263175 | A1 * | 8/2021 | Lloyd | ....................... G01V 1/28 |
| 2021/0301626 | A1 * | 9/2021 | Kayum | ................... E21B 41/00 |
| 2022/0228465 | A1 | 7/2022 | Madasu | |
| 2024/0018863 | A1 | 1/2024 | Ambade | |

* cited by examiner

*Primary Examiner* — Catherine Loikith
(74) *Attorney, Agent, or Firm* — Kyle R. Miiller

(57) ABSTRACT

A method for optimizing an integrated network related to a wellsite. The method includes inputting data related to an integrated network of a wellsite, simultaneously simulating a flow within a first and second plurality of flowlines within the integrated network based on the input data, and determining a first output for the well based on the simultaneously simulated flows within the first and second plurality of flowlines. The input data related to the integrated network may be revised so that a flow within the first and second plurality of flowlines may be simultaneously re-simulated within the integrated network based on the revised input data. A further output for the well may be then determined and displayed on a screen.

20 Claims, 8 Drawing Sheets

500

| | Name | Type | Branch | Pressure (out) | Temperature... |
|---|---|---|---|---|---|
| | | | | psia ▾ | degF ▾ |
| 7 + | Ck6 | Choke | | 2036.101 | 93.77147 |
| 8 + | Ck7 | Choke | | 1761.274 | 90.98955 |
| 9 + | Completion | Completion | Well6 | 2483.236 | 211.4234 |
| 10 + | Completion | Completion | Well3 | 2465.042 | 211.5154 |
| 11 + | Completion | Completion | Well4 | 2479.94 | 211.4401 |
| 12 + | Completion | Completion | Well5 | 2460.264 | 211.5396 |
| 13 + | Completion | Completion | Well2 | 2448.771 | 211.5977 |
| 14 + | Completion | Completion | Well8 | 2503.35 | 211.3217 |
| 15 + | Completion | Completion | Well7 | 2477.924 | 211.4503 |
| 16 + | Completion | Completion | Well1 | 2455.054 | 211.5659 |
| 17 + | SLB (Camco)_RDO | Gas Lift Injection | Well8 | 2241.451 | 203.515 |
| 18 + | SLB (Camco)_RDO | Gas Lift Injection | Well3 | 2206.703 | 204.099 |
| 19 + | SLB (Camco)_RDO | Gas Lift Injection | Well4 | 2221.548 | 203.5789 |
| 20 + | SLB (Camco)_RDO | Gas Lift Injection | Well7 | 2219.687 | 203.4445 |
| 21 + | SLB (Camco)_RDO | Gas Lift Injection | Well2 | 2190.28 | 204.0704 |
| 22 + | SLB (Camco)_RDO | Gas Lift Injection | Well6 | 2224.952 | 203.8035 |
| 23 + | SLB (Camco)_RDO | Gas Lift Injection | Well5 | 2201.829 | 204.0874 |
| 24 + | SLB (Camco)_RDO | Gas Lift Injection | Well1 | 2196.533 | 203.9907 |
| 25 | J 1 | Junction | | 341.8842 | 112.8555 |
| 26 | J 10 | Junction | | 2162.004 | 95.56161 |
| 27 | J 2 | Junction | | 307.4787 | 115.908 |
| 28 | J 3 | Junction | | 364.9276 | 119.6682 |
| 29 | J 4 | Junction | | 372.8733 | 117.7534 |
| 30 | J 5 | Junction | | 324.0861 | 118.2927 |
| 31 | J 6 | Junction | | 2189.28 | 98.56506 |
| 32 | J 7 | Junction | | 2178.639 | 96.8471 |
| 33 | J 8 | Junction | | 2174.279 | 96.87322 |
| 34 | J 9 | Junction | | 2163.635 | 94.60743 |
| 35 | Sk | Sink | Sk | 300 | 114.6206 |
| 36 | Src | Source | Src | 2200 | 100 |

| ST liquid rate | ST Oil rate | ST Water rate | ST Gas rate | ST GOR | ST WCUT | FT Gas rate (... | FL WCUT |
|---|---|---|---|---|---|---|---|
| STB/d ▾ | STB/d ▾ | STB/d ▾ | mmscf/d ▾ | SCF/STB ▾ | % ▾ | mmcf/d ▾ | % ▾ |
| 0 | 0 | 0 | 6.899399 |  | 0 | 0.0400188 | 0 |
| 0 | 0 | 0 | 4.53033 |  | 0 | 0.0306176 | 0 |
| 1183.41 | 710.0459 | 473.3639 | 0.1881622 | 265 | 40 | 0 | 36.87367 |
| 1259.823 | 755.8935 | 503.929 | 0.2003118 | 265 | 40 | 0 | 36.87192 |
| 1197.252 | 718.3513 | 478.9008 | 0.1903631 | 265 | 40 | 0 | 36.87336 |
| 1279.892 | 767.9353 | 511.9569 | 0.2035029 | 265 | 40 | 0 | 36.87145 |
| 1328.161 | 796.8965 | 531.2643 | 0.2111776 | 265 | 40 | 0 | 36.87031 |
| 1098.932 | 659.3592 | 439.5728 | 0.1747302 | 265 | 40 | 0 | 36.87556 |
| 1205.721 | 723.4323 | 482.2882 | 0.1917096 | 265 | 40 | 0 | 36.87317 |
| 1301.771 | 781.0629 | 520.7086 | 0.2069817 | 265 | 40 | 0 | 36.87094 |
| 0 | 0 | 0 | 5.761737 |  | 0 | 0.04200165 | 0 |
| 0 | 0 | 0 | 7.549691 |  | 0 | 0.05602387 | 0 |
| 0 | 0 | 0 | 6.381077 |  | 0 | 0.04695955 | 0 |
| 0 | 0 | 0 | 4.519282 |  | 0 | 0.03327618 | 0 |
| 0 | 0 | 0 | 7.617924 |  | 0 | 0.05697043 | 0 |
| 0 | 0 | 0 | 6.902178 |  | 0 | 0.05074177 | 0 |
| 0 | 0 | 0 | 7.566516 |  | 0 | 0.05627726 | 0 |
| 0 | 0 | 0 | 7.466235 |  | 0 | 0.05565825 | 0 |
| 2296.185 | 1377.711 | 918.4742 | 12.5079 | 9078.752 | 40 | 0.5617678 | 38.89346 |
| 0 | 0 | 0 | 14.45948 |  | 0 | 0.07913633 | 0 |
| 9853.141 | 5911.884 | 3941.256 | 55.32033 | 9357.479 | 40 | 2.796692 | 38.95101 |
| 2462.547 | 1477.528 | 985.0188 | 14.85578 | 10054.48 | 40 | 0.6319569 | 38.80464 |
| 2464.47 | 1478.682 | 985.788 | 12.45438 | 8422.62 | 40 | 0.5149623 | 38.79797 |
| 6255.18 | 3753.108 | 2502.072 | 35.13924 | 9362.703 | 40 | 1.688836 | 38.9011 |
| 0 | 0 | 0 | 53.80031 |  | 0 | 0.293818 | 0 |
| 0 | 0 | 0 | 12.19272 |  | 0 | 0.06650788 | 0 |
| 0 | 0 | 0 | 34.1347 |  | 0 | 0.1866093 | 0 |
| 0 | 0 | 0 | 12.05578 |  | 0 | 0.06569186 | 0 |
| 9853.141 | 5911.884 | 3941.256 | 55.32033 | 9357.479 | 40 | 2.862615 | 38.97489 |
| 0 | 0 | 0 | 53.80031 |  | 0 | 0.2938485 | 0 |

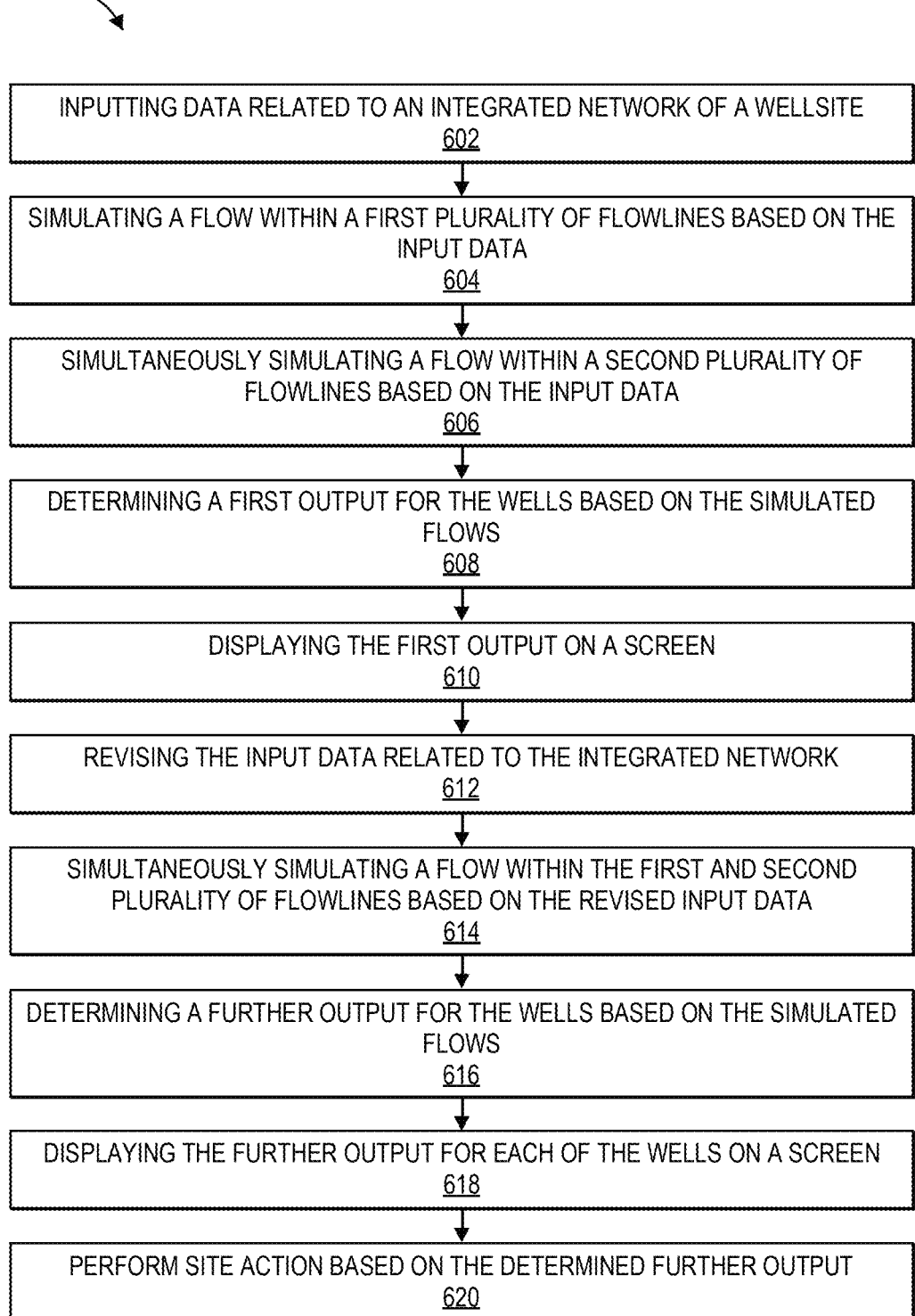

INPUTTING DATA RELATED TO AN INTEGRATED NETWORK OF A WELLSITE
602

SIMULATING A FLOW WITHIN A FIRST PLURALITY OF FLOWLINES BASED ON THE INPUT DATA
604

SIMULTANEOUSLY SIMULATING A FLOW WITHIN A SECOND PLURALITY OF FLOWLINES BASED ON THE INPUT DATA
606

DETERMINING A FIRST OUTPUT FOR THE WELLS BASED ON THE SIMULATED FLOWS
608

DISPLAYING THE FIRST OUTPUT ON A SCREEN
610

REVISING THE INPUT DATA RELATED TO THE INTEGRATED NETWORK
612

SIMULTANEOUSLY SIMULATING A FLOW WITHIN THE FIRST AND SECOND PLURALITY OF FLOWLINES BASED ON THE REVISED INPUT DATA
614

DETERMINING A FURTHER OUTPUT FOR THE WELLS BASED ON THE SIMULATED FLOWS
616

DISPLAYING THE FURTHER OUTPUT FOR EACH OF THE WELLS ON A SCREEN
618

PERFORM SITE ACTION BASED ON THE DETERMINED FURTHER OUTPUT
620

FIG. 6

METHOD FOR SIMULTANEOUSLY COMBINING A PRODUCTION NETWORK AND AN INJECTION NETWORK WITHIN A SINGLE WORKFLOW

BACKGROUND

Many wellsites include a number of wells arrayed in a production network that are used for extracting hydrocarbons from a subsurface of the wellsite. Additionally, a wellsite may also include a separate network to inject gas into the wellbore of the same oil-producing wells in order to lower the density of the hydrocarbon flow, thereby providing a "gas-lift" and allowing the wells within the production network to perform more efficiently. When planning or developing a wellsite, the production network and the injection network would have to be modeled separately for a given wellsite and then combined into a further projection.

For example, previous methods have introduced the ability to model wells that include single flow streams, while the hydraulics of the gas forming the gas-lift in the annulus are modeled optionally to calculate the casing-head pressure required for injecting a specified amount of gas. Additionally, the gas that is injected into the annulus to lift the heavy hydrocarbon can be modeled by physically simulating the flowlines that transport the gas from a source to the casing head port. Conventionally, simulation of production pipeline networks utilizing gas-lifted wells may be performed by "assigning" a gas flow rate used in the gas-lift to each well individually. Other workflows combine production and injection network, but not simultaneously. Instead, an automatic workflow is developed to run one simulation for one network, take the results from the first simulation and feed it to a second simulation for the other network, and then try to converge into a solution. Another approach has been to use results obtained from a simulation of a first network and its related boundary conditions as input for a simulation for a second network, also known as loose coupling. What is needed is the ability to simultaneously model the impact of the hydraulics of the flowlines that transport and distribute the gas-lift gas into all the wells and the flowlines that transport hydrocarbons from the production wells.

SUMMARY

Disclosed are methods, systems, and computer programs for optimizing an integrated network related to a wellsite. The method includes inputting data related to an integrated network of a wellsite. In certain embodiments, inputting data related to the integrated network includes inputting a first set of parameters related to a plurality of wells within the integrated network and constructing a configuration of the integrated network on a graphical interface. In certain embodiments, inputting the first or second set of parameters related to the wells within the integrated network includes inputting a surface injection rate, a surface injection pressure, a surface injection temperature, or a minimum valve injection differential pressure. In certain embodiments, constructing the configuration of the integrated network on the graphical interface includes displaying a visual representation of the wellsite on the graphical interface, placing a location of the source and the sink on the visual representation of the wellsite, placing a location of the wells on the visual representation of the wellsite, and connecting the first and second plurality of flowlines between the source, the wells, and the sink on the visual representation of the wellsite. The method also includes simulating a first flow within a first plurality of flowlines within the integrated network based on the input data. In certain embodiments, the first plurality of flowlines may be configured to distribute gas from a source to the wells within the integrated network. The method also includes simultaneously simulating a first flow within a second plurality of flowlines within the integrated network based on the input data. In certain embodiments, the second plurality of flowlines may be configured to transport a fluid from the wells to a sink within the integrated network. The method also includes determining a first output for the wells based on the simultaneously simulated flows within the first and second plurality of flowlines and then displaying the output for each of the wells on a screen. The method may also include revising the input data that is related to the integrated network. In certain embodiments, revising the input data related to the integrated network includes inputting a second set of parameters related to the wells within the integrated network or adjusting the configuration of the integrated network on the graphical interface. The method may also include simultaneously simulating a second flow within the first and second plurality of flowlines within the integrated network based on the revised input data, determining a further output for the well based on the simultaneously simulated second flows within the first and second plurality of flowlines, and then displaying the further output for each of the wells on a screen. According to certain embodiments, the method includes performing a site action based on the determined further output, wherein performing the site action comprises generating or transmitting a signal that instructs or causes an action to occur, wherein the action includes a physical action, and wherein the physical action includes adjusting a flow of fluid within a pipeline or wellbore, varying an amount of lift-gas delivered into a wellbore, varying a production amount from a wellbore, reconfiguring the integrated network, or a combination thereof.

BRIEF DESCRIPTION OF THE DRAWINGS

The disclosure is illustrated by way of example, and not by way of limitation in the figures of the accompanying drawings in which like reference numerals are used to refer to similar elements. It is appreciated that various features may not be drawn to scale, and the dimensions of various features may be arbitrarily increased or reduced for clarity of discussion. Further, it is contemplated that features of one or more embodiments may be incorporated in other embodiments without additional recitation.

FIG. 5 illustrates an output screen of a graphical interface displaying a determined output of the integrated network, according to an embodiment.

FIG. 6 illustrates a flowchart of a method for optimizing an integrated network related to a wellsite, according to an embodiment.

DETAILED DESCRIPTION

Reference will now be made in detail to embodiments, examples of which are illustrated in the accompanying drawings and figures. In the following detailed description, numerous specific details are set forth in order to provide a thorough understanding of the disclosed technology. However, it will be apparent to one of ordinary skill in the art that the disclosed embodiments may be practiced without these specific details. In other instances, well-known methods, procedures, components, circuits, and networks have not been described in detail so as not to unnecessarily obscure aspects of the embodiments.

It will also be understood that, although the terms first, second, etc., may be used herein to describe various elements, these elements should not be limited by these terms. These terms are used to distinguish one element from another. For example, a first object or step could be termed a second object or step, and, similarly, a second object or step could be termed a first object or step, without departing from the scope of the disclosure. The first object or step, and the second object or step, are both objects or steps, respectively, but they are not to be considered the same object or step.

The terminology used in the description of the disclosed techniques is for the purpose of describing particular embodiments and is not intended to be limiting. As used in the description of this disclosure and the appended claims, the singular forms "a," "an" and "the" are intended to include the plural forms as well, unless the context clearly indicates otherwise. It will also be understood that the term "and/or" as used herein refers to and encompasses any combination of one or more of the associated listed items. It will be further understood that the terms "includes," "including," "comprises" and/or "comprising," when used in this disclosure, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in response to detecting," depending on the context.

Those with skill in the art will appreciate that while some terms in this disclosure may refer to absolutes, e.g., all of the components of a wavefield, all source receiver traces, each of a plurality of objects, etc., the methods and techniques disclosed herein may also be performed on fewer than all of a given thing, e.g., performed on one or more components and/or performed on one or more source receiver traces. Accordingly, in instances in the disclosure where an absolute is used, the disclosure may also be interpreted to be referring to a subset.

System Overview

Figure 1:
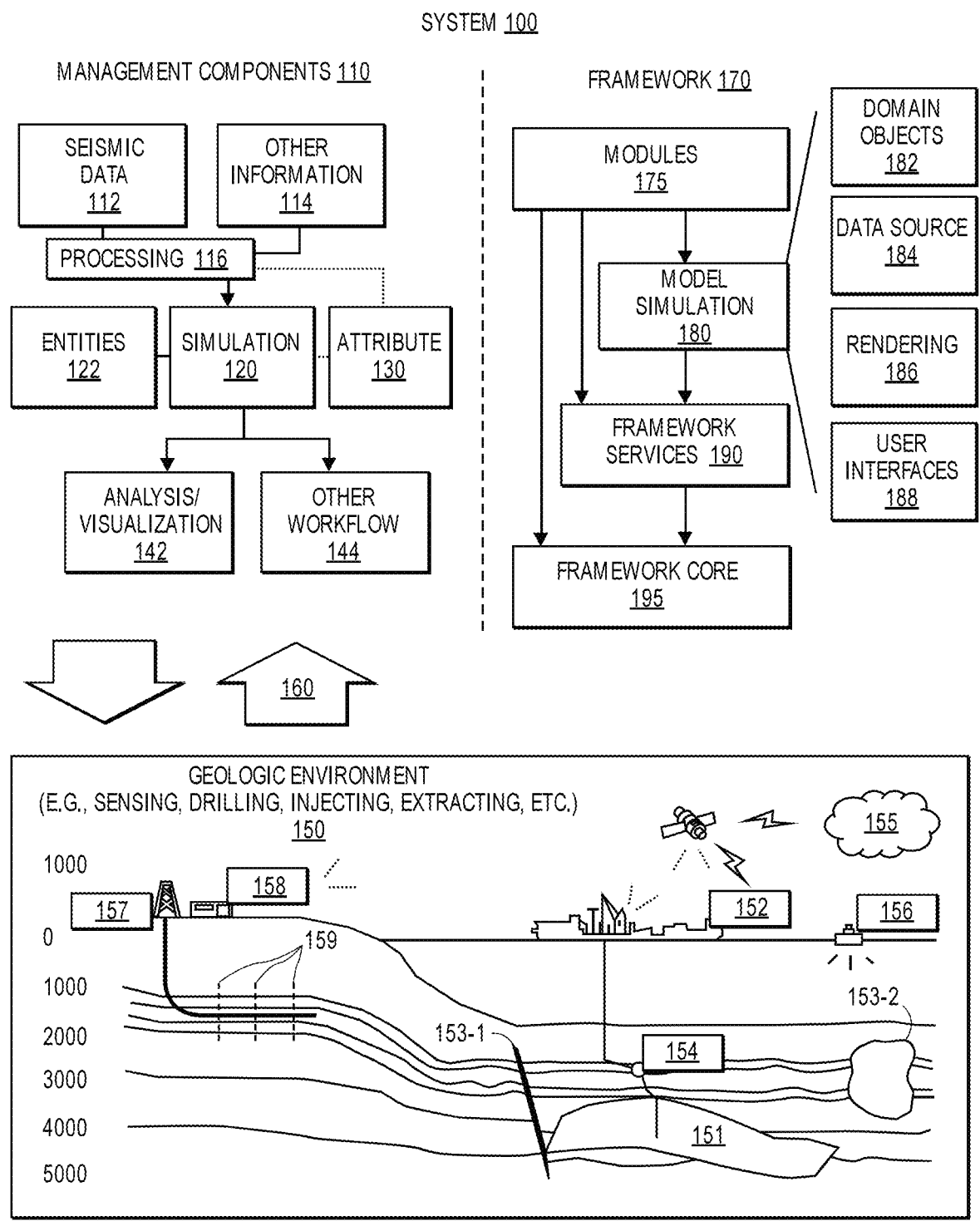
FIG. 1 illustrates an example of a system that includes various management components to manage various aspects of a geologic environment, according to an embodiment.

FIG. 1 illustrates an example of a system 100 that includes various management components 110 to manage various aspects of a geologic environment 150 (e.g., an environment that includes a sedimentary basin, a reservoir 151, one or more faults 153-1, one or more geobodies 153-2, etc.). For example, the management components 110 may allow for direct or indirect management of sensing, drilling, injecting, extracting, etc., with respect to the geologic environment 150. In turn, further information about the geologic environment 150 may become available as feedback 160 (e.g., optionally as input to one or more of the management components 110).

In the example of FIG. 1, the management components 110 include a seismic data component 112, an additional information component 114 (e.g., well/logging data), a processing component 116, a simulation component 120, an attribute component 130, an analysis/visualization component 142 and a workflow component 144. In operation, seismic data and other information provided per the components 112 and 114 may be input to the simulation component 120.

In an example embodiment, the simulation component 120 may rely on entities 122. Entities 122 may include earth entities or geological objects such as wells, surfaces, bodies, reservoirs, etc. In the system 100, the entities 122 can include virtual representations of actual physical entities that are reconstructed for purposes of simulation. The entities 122 may include entities based on data acquired via sensing, observation, etc. (e.g., the seismic data 112 and other information 114). An entity may be characterized by one or more properties (e.g., a geometrical pillar grid entity of an earth model may be characterized by a porosity property). Such properties may represent one or more measurements (e.g., acquired data), calculations, etc.

In an example embodiment, the simulation component 120 may operate in conjunction with a software framework such as an object-based framework. In such a framework, entities may include entities based on pre-defined classes to facilitate modeling and simulation. A commercially available example of an object-based framework is the MICROSOFT®.NET© framework (Redmond, Washington), which provides a set of extensible object classes. In the .NET® framework, an object class encapsulates a module of reusable code and associated data structures. Object classes can be used to instantiate object instances for use in by a program, script, etc. For example, borehole classes may define objects for representing boreholes based on well data.

In the example of FIG. 1, the simulation component 120 may process information to conform to one or more attributes specified by the attribute component 130, which may include a library of attributes. Such processing may occur prior to input to the simulation component 120 (e.g., consider the processing component 116). As an example, the simulation component 120 may perform operations on input information based on one or more attributes specified by the attribute component 130. In an example embodiment, the simulation component 120 may construct one or more models of the geologic environment 150, which may be relied on to simulate behavior of the geologic environment 150 (e.g., responsive to one or more acts, whether natural or artificial). In the example of FIG. 1, the analysis/visualization component 142 may allow for interaction with a model or model-based results (e.g., simulation results, etc.). As an example, output from the simulation component 120 may be input to one or more other workflows, as indicated by a workflow component 144.

As an example, the simulation component 120 may include one or more features of a simulator such as the ECLIPSE™ reservoir simulator (SLB, Houston Texas), the INTERSECT™ reservoir simulator (SLB, Houston Texas), etc. As an example, a simulation component, a simulator, etc. may include features to implement one or more meshless techniques (e.g., to solve one or more equations, etc.). As an example, a reservoir or reservoirs may be simulated with respect to one or more enhanced recovery techniques (e.g., consider a thermal process such as SAGD, etc.).

In an example embodiment, the management components 110 may include features of a commercially available framework such as the PETREL® seismic to simulation software framework (SLB, Houston, Texas). The PETREL® framework provides components that allow for optimization of exploration and development operations. The PETREL® framework includes seismic to simulation software components that can output information for use in increasing reservoir performance, for example, by improving asset team productivity. Through use of such a framework, various professionals (e.g., geophysicists, geologists, and reservoir engineers) can develop collaborative workflows and integrate operations to streamline processes. Such a framework may be considered an application and may be considered a data-driven application (e.g., where data is input for purposes of modeling, simulating, etc.).

In an example embodiment, various aspects of the management components 110 may include add-ons or plug-ins that operate according to specifications of a framework environment. For example, a commercially available framework environment marketed as the OCEAN® framework environment (SLB, Houston, Texas) allows for integration of add-ons (or plug-ins) into a PETREL® framework workflow. The OCEAN® framework environment leverages .NET® tools (Microsoft Corporation, Redmond, Washington) and offers stable, user-friendly interfaces for efficient development. In an example embodiment, various components may be implemented as add-ons (or plug-ins) that conform to and operate according to specifications of a framework environment (e.g., according to application programming interface (API) specifications, etc.).

FIG. 1 also shows an example of a framework 170 that includes a model simulation layer 180 along with a framework services layer 190, a framework core layer 195 and a modules layer 175. The framework 170 may include the commercially available OCEAN® framework where the model simulation layer 180 is the commercially available PETREL® model-centric software package that hosts OCEAN® framework applications. In an example embodiment, the PETREL® software may be considered a data-driven application. The PETREL® software can include a framework for model building and visualization.

As an example, a framework may include features for implementing one or more mesh generation techniques. For example, a framework may include an input component for receipt of information from interpretation of seismic data, one or more attributes based at least in part on seismic data, log data, image data, etc. Such a framework may include a mesh generation component that processes input information, optionally in conjunction with other information, to generate a mesh.

In the example of FIG. 1, the model simulation layer 180 may provide domain objects 182, act as a data source 184, provide for rendering 186 and provide for various user interfaces 188. Rendering 186 may provide a graphical environment in which applications can display their data while the user interfaces 188 may provide a common look and feel for application user interface components.

As an example, the domain objects 182 can include entity objects, property objects and optionally other objects. Entity objects may be used to geometrically represent wells, surfaces, bodies, reservoirs, etc., while property objects may be used to provide property values as well as data versions and display parameters. For example, an entity object may represent a well where a property object provides log information as well as version information and display information (e.g., to display the well as part of a model).

In the example of FIG. 1, data may be stored in one or more data sources (or data stores, generally physical data storage devices), which may be at the same or different physical sites and accessible via one or more networks. The model simulation layer 180 may be configured to model projects. As such, a particular project may be stored where stored project information may include inputs, models, results and cases. Thus, upon completion of a modeling session, a user may store a project. At a later time, the project can be accessed and restored using the model simulation layer 180, which can recreate instances of the relevant domain objects.

In the example of FIG. 1, the geologic environment 150 may include layers (e.g., stratification) that include a reservoir 151 and one or more other features such as the fault 153-1, the geobody 153-2, etc. As an example, the geologic environment 150 may be outfitted with any of a variety of sensors, detectors, actuators, etc. For example, equipment 152 may include communication circuitry to receive and to transmit information with respect to one or more networks 155. Such information may include information associated with downhole equipment 154, which may be equipment to acquire information, to assist with resource recovery, etc. Other equipment 156 may be located remote from a well site and include sensing, detecting, emitting or other circuitry. Such equipment may include storage and communication circuitry to store and to communicate data, instructions, etc. As an example, one or more satellites may be provided for purposes of communications, data acquisition, etc. For example, FIG. 1 shows a satellite in communication with the network 155 that may be configured for communications, noting that the satellite may additionally or instead include circuitry for imagery (e.g., spatial, spectral, temporal, radiometric, etc.).

FIG. 1 also shows the geologic environment 150 as optionally including equipment 157 and 158 associated with a well that includes a substantially horizontal portion that may intersect with one or more fractures 159. For example, consider a well in a shale formation that may include natural fractures, artificial fractures (e.g., hydraulic fractures) or a combination of natural and artificial fractures. As an example, a well may be drilled for a reservoir that is laterally extensive. In such an example, lateral variations in properties, stresses, etc. may exist where an assessment of such variations may assist with planning, operations, etc. to develop a laterally extensive reservoir (e.g., via fracturing, injecting, extracting, etc.). As an example, the equipment 157 and/or 158 may include components, a system, systems, etc. for fracturing, seismic sensing, analysis of seismic data, assessment of one or more fractures, etc.

As mentioned, the system 100 may be used to perform one or more workflows. A workflow may be a process that includes a number of worksteps. A workstep may operate on data, for example, to create new data, to update existing data, etc. As an example, a workstep may operate on one or more inputs and create one or more results, for example, based on one or more algorithms. As an example, a system may include a workflow editor for creation, editing, executing, etc. of a workflow. In such an example, the workflow editor may provide for selection of one or more pre-defined worksteps, one or more customized worksteps, etc. As an example, a workflow may be a workflow implementable in the PETREL® software, for example, that operates on seismic data, seismic attribute(s), etc. As an example, a workflow may be a process implementable in the OCEAN® framework. As an example, a workflow may include one or more worksteps that access a module such as a plug-in (e.g., external executable code, etc.).

Figure 2:
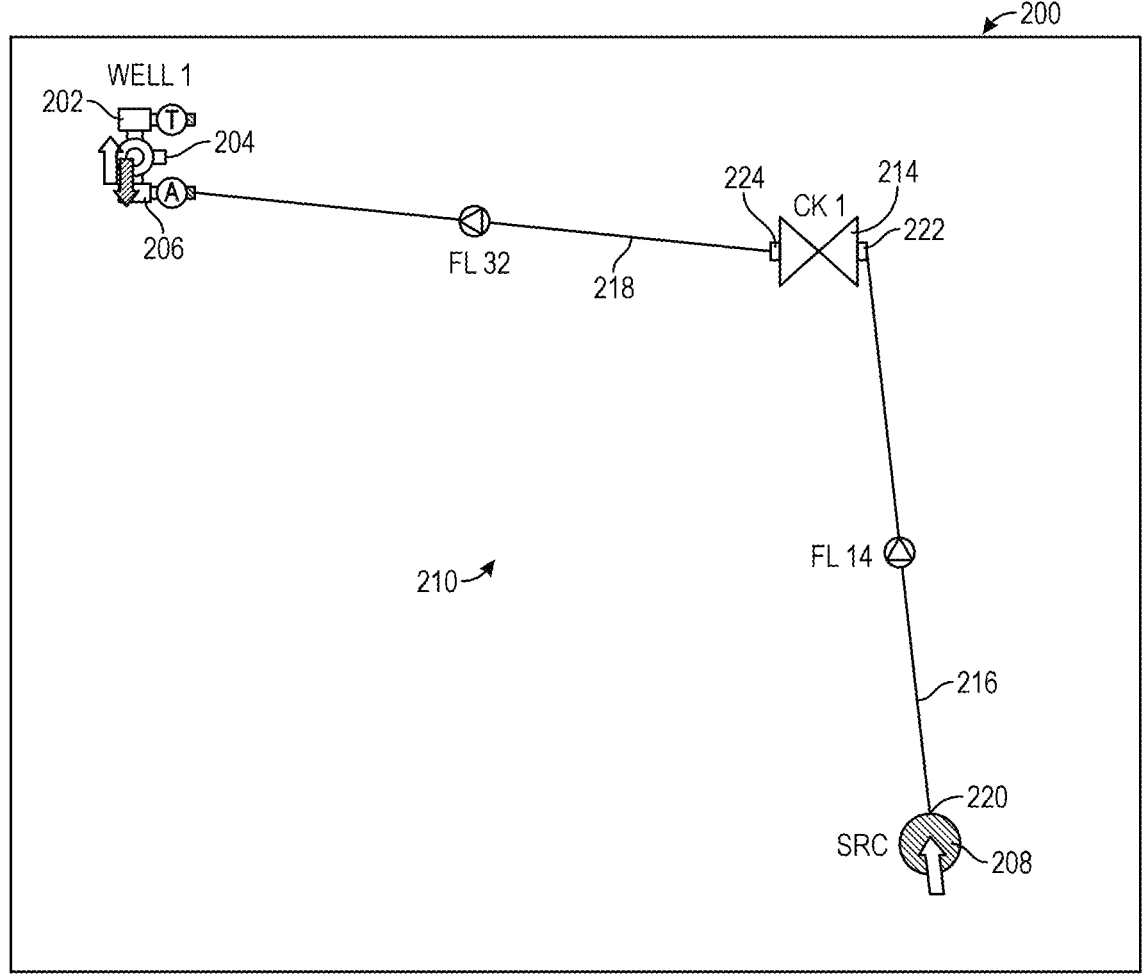
FIG. 2 illustrates a configuration of an integrated network having a source and a single well, according to an embodiment.

Method for Simultaneously Combining a Production Network and an Injection Network within a Single Workflow FIG. 2 illustrates a graphical interface 200 used to form an integrated system 210 which may include a combined network of production wells and injection wells 202 that are to be used at a wellsite, according to an embodiment. The integrated system 210 may be constructed by connecting a production port 204 of each well 202 to a production network and then connecting a gas-lift injection port 206 to a gas-lift injection network, thereby simultaneously forming the fully integrated system 210.

According to certain embodiments, the integrated system 210 may include a source 208 (also labeled "SRC") for a gas or other fluid that may be placed at a desired position within the graphical interface 200. In certain embodiments, the gas or fluid stored in the source 208 may be used for providing a gas-lift in one or more wells 202 disposed at the wellsite. Additional wellsite equipment including but not limited to wells 202, choke valves 214 (also labeled "CK 1"), junctions, sinks, and other sources may also be placed on the graphical interface 200 according to the specific goals of the user and/or the known boundary conditions of the wellsite. In certain embodiments, the relative positions of the source 208, wells 202, or other wellsite equipment may be determined according to the conditions of a specific wellsite, for example geophysical features. A first flowline 216 may be added to the graphical interface 200 by starting at an initial point, for example at an output 220 of the source 208, and then connecting it to the input 222 of the wellsite equipment, for example a choke valve 214 as seen in FIG. 2. A second flowline 218 may then be added between the choke valve 214 and a first well 202 by starting at an output 224 of the choke valve 214 and ending the second flowline 218 at the injection port 206 of the first well 202. In certain embodiments, placement of the flowlines 216, 218, the source 208, the first well 202, and any other wellsite equipment on the graphical interface 200 may be done through dragging and dropping of icons related to each component or by any other means for engaging with a display of a computer system associated with the graphical interface 200, including but not limited to mouse and keyboard, touchscreen interfaces, or the like. In certain embodiments, the process may be repeated by connecting further flowlines between the production port 204 of the first well 202 and the input for a sink (not seen), such as a storage tank, with any number or variety of wellsite equipment disposed there between.

Figure 3:
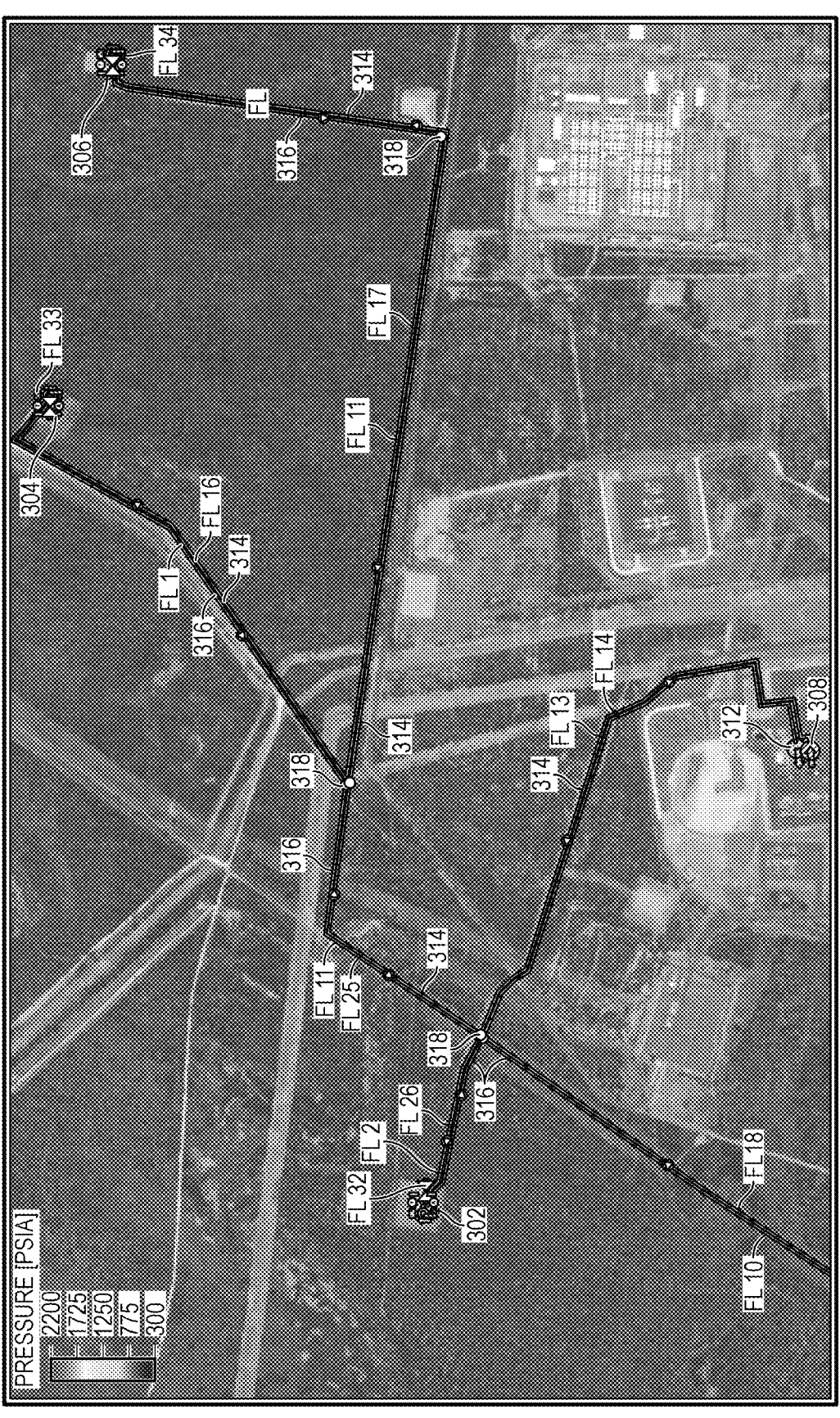
FIG. 3 illustrates a configuration of an integrated network disposed over a visual representation of a wellsite, according to an embodiment.

In certain embodiments and as seen in FIG. 3, the process of adding wellsite equipment and flowlines FL, FL2, FL1, FL2, FL10, FL11, FL13, FL14, FL16, FL17, FL18, FL25, FL26, FL32, FL33, and FL34 may be repeated multiple times until the integrated network 310 includes a plurality of wells 302-306 over an entire wellsite or area of interest. In certain embodiments, the graphical interface 300 may include a map, an overlay of a top down view, a satellite image, or other visual representation of the wellsite. The integrated network 310 may be unique to the specific location, geographic features, or the pre-existing facilities of the wellsite as depicted in the graphical interface 300 which may function as boundary conditions for forming the integrated network 310.

In certain embodiments, the integrated network 310 may include a first well 302, a second well 304, and a third well 306, each in communication with a source 308 and a sink 312 via a network of corresponding flowlines, namely a network of gas-lift flowlines 314 and a network of production flowlines 316. In certain embodiments, the integrated network 310 may also include a plurality of junctions 318 at points where multiple flowlines 314, 316 intersect, cross paths, or change directions relative to the wellsite. Each of the wells 302-306 as well as the source 308 or sink 312 may be pre-existing within the graphical interface 300, or may alternatively be implemented or placed by the user before or after any of the flowlines 314, 316 are placed. In certain embodiments, the graphical interface 300 may also simultaneously display parameters related to the integrated network 310 including but not limited to a flow direction in each of the flowlines 314, 316 or a pressure within each of the wells 302-306.

Figure 4:
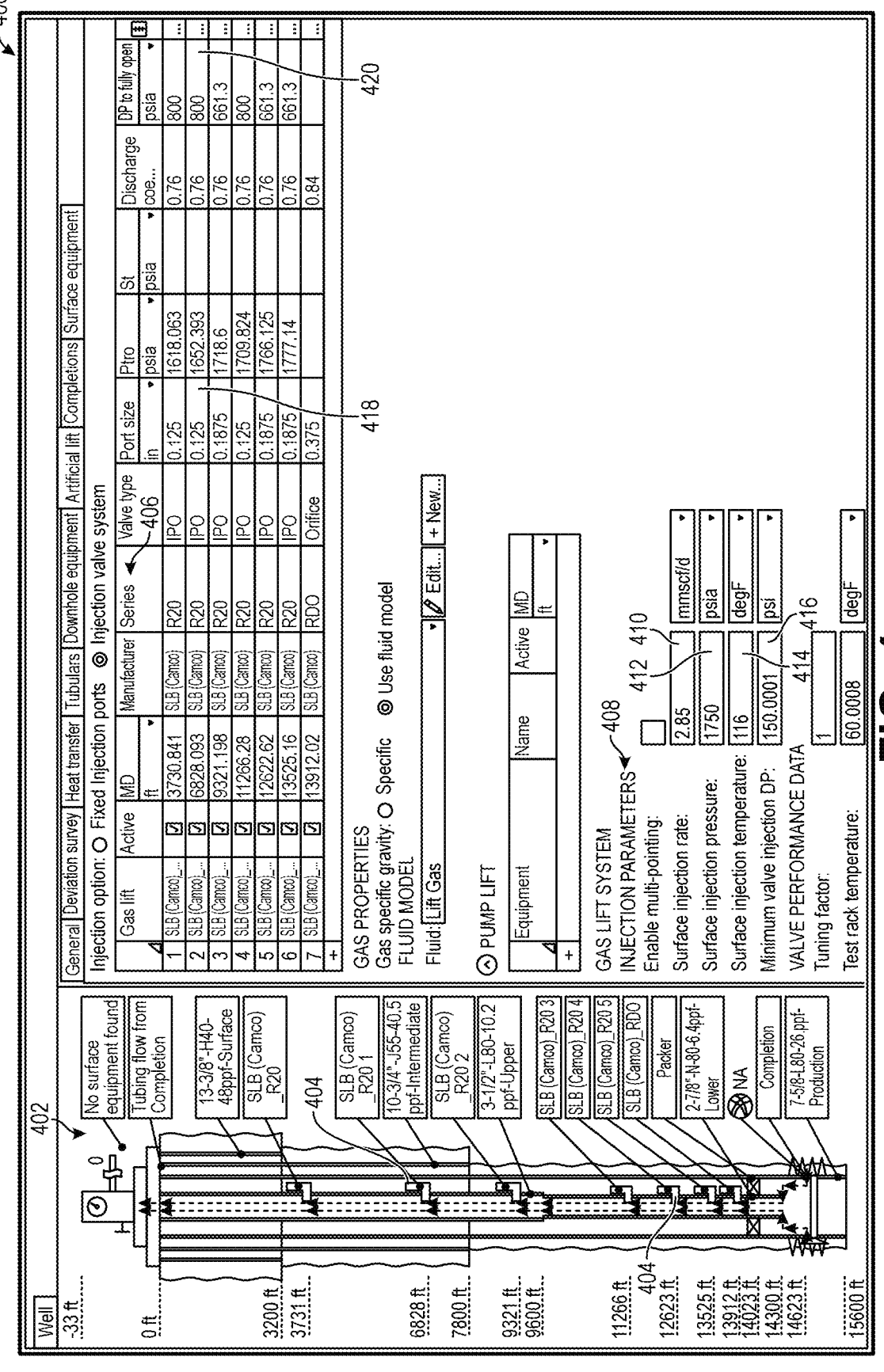
FIG. 4 illustrates an input screen of a graphical interface used to input gas-lift injection parameters, according to an embodiment.

Once the integrated network 310 seen in FIG. 3 has been established, the specific parameters for each of the wells in the integrated network 310 may be determined or adjusted using the graphical interface 400 seen in FIG. 4, according to certain embodiments. For example, upon the selection of one of the wells 302-306 of FIG. 3, the graphical interface 400 may include a visual representation 402 of the selected well. In certain embodiments, the visual representation 402 may include a representation of each of the gas-lift valves 404 present within the selected well. The visual representation 402 may also include a corresponding depth for each of gas-lift valves 404, as well as any related information including but not limited to a manufacturer of the gas-lift valve 404 and related specifications such as a size or model number. In certain embodiments, the graphical interface 400 also includes a table 406 which may display any corresponding information related to the gas-lift valves 404 including but not limited to a port size 418 and a required pressure 420 to fully open each gas-lift valve 404.

In certain embodiments, the graphical interface 400 may include a gas-lift parameter input block 408. The gas-lift parameter input block 408 may include multiple fields allowing a user to input a desired set of parameters corresponding to the selected well displayed within the visual representation 402. For example, the gas-lift parameter input block 408 may include multiple different fields for a user to enter a number of different input parameters for the selected well including but not limited to a surface injection rate 410, a surface injection pressure 412, a surface injection temperature 414, and a minimum valve injection differential pressure 416. In certain embodiments, the units displayed for each input parameter may be changed via a corresponding drop down menu. In certain embodiments, each of the wells 302-306 within the integrated network 310 may be selected and have their respective gas-lift parameters adjusted as needed so as to provide the optimal amount of gas injected into the gas-lift network of flowlines 314.

After the parameters for each of the wells 302-306 within the integrated network 310 have been set, the workflow includes running a simulation which has the ability to combine, integrate and simultaneously solve the integrated network 310 which includes both the production flowlines 316 with the associated gas-lift injection flowlines 316. In certain embodiments, the simulation produces a set of results which may be displayed in tabular form within a graphical interface 500 as seen in FIG. 5. The graphical interface 500 may include a list of all the names 502 and a corresponding type 504 for each of the components within the integrated network, for example the integrated network 310 seen in FIG. 3. For each of the components within the integrated network, the graphical interface 500 may display a plurality of results that are based on the specific configuration or size of the integrated network and the specific parameters that have been input for each well within the integrated network as seen in FIG. 4. In certain embodiments, the displayed results for each component within the integrated network may include but is not limited to an out pressure 506, a temperature 508, an oil production rate 510, a water production rate 512, a gas injection rate 514, and a ratio of water produced relative to the oil produced 516.

According to certain embodiments, the simulation of the workflow may be iterative and ran multiple times in succession to produce the most efficient results which may include maximizing the oil production rate 510 while minimizing the gas injection rate 514. For example, the parameters within the gas-lift parameter input block 408 of FIG. 4, or the configuration or layout of the integrated network 310 of FIG. 3, or a combination thereof, may be changed or adjusted between each simulation run until an ideal or desired outcome is reflected in the results of the graphical interface 500. In certain embodiments, the workflow enables studying the impact of the interconnected wells within the integrated network 310 and their corresponding hydraulics used for gas-lift injection.

Exemplary Workflow

FIG. 6 provides an exemplary detailed workflow 600 for optimizing an integrated network related to a wellsite. It is appreciated that a signal processing engine stored in a memory device (e.g., transitory or non-transitory memory) may cause a computer processor to assist or otherwise facilitate execution of one or more of the various processing stages of workflow 600.

According to certain embodiments, the workflow 600 includes inputting data related to an integrated network of a wellsite, as at 602. In certain embodiments, inputting data related to the integrated network includes inputting a first set of parameters that are related to a plurality of wells within the integrated network and constructing the integrated network on a graphical interface. In certain embodiments, constructing the integrated network on the graphical interface includes displaying a visual representation of the wellsite on the graphical interface, placing a location of a source and a sink on the visual representation of the wellsite, placing a location of the wells on the visual representation of the wellsite, and connecting a plurality of flowlines between the source, the at least one well, and the sink at a location on the visual representation of the wellsite.

According to certain embodiments, the workflow 600 includes simulating a flow within a first plurality of flowlines within the integrated network based on the input data, as at 604. In certain embodiments, the first plurality of flowlines are configured to distribute gas from a source to the well within the integrated network.

According to certain embodiments, the workflow 600 includes simultaneously simulating a flow within a second plurality of flowlines within the integrated network based on the input data, as at 606. In certain embodiments, the second plurality of flowlines are configured to transport a fluid from the well to a sink within the integrated network.

According to certain embodiments, the workflow 600 includes determining a first output for the well based on the simultaneously simulated flows within the first and second plurality of flowlines, as at 608.

According to certain embodiments, the workflow 600 includes displaying the first output for each of the wells on a screen, as at 610.

According to certain embodiments, the workflow 600 includes revising the input data related to the integrated network, as at 612. In certain embodiments, revising the input data related to the integrated network includes inputting a second set of parameters that are related to the wells within the integrated network or adjusting the integrated network on the graphical interface. In certain embodiments, inputting the first or second set of parameters related to the wells within the integrated network includes inputting a surface injection rate, a surface injection pressure, a surface injection temperature, or a minimum valve injection differential pressure.

According to certain embodiments, the workflow 600 includes simultaneously simulating a flow within the first and second plurality of flowlines within the integrated network based on the revised input data, as at 614.

According to certain embodiments, the workflow 600 includes determining a further output for the wells based on the simultaneously simulated flows within the first and second plurality of flowlines, as at 616.

According to certain embodiments, the workflow 600 includes displaying the further output for each of the wells on a screen, as at 618.

According to certain embodiments, the workflow 600 includes performing a site action based on the determined further output, as at 620. In certain embodiments, performing the site action includes generating or transmitting a signal that instructs or causes an action to occur, wherein the action includes a physical action, and wherein the physical action includes adjusting a flow of fluid within a pipeline or wellbore, varying an amount of lift-gas delivered into a wellbore, varying a production amount from a wellbore, reconfiguring the integrated network, or a combination thereof.

Exemplary Computing System

Figure 7:
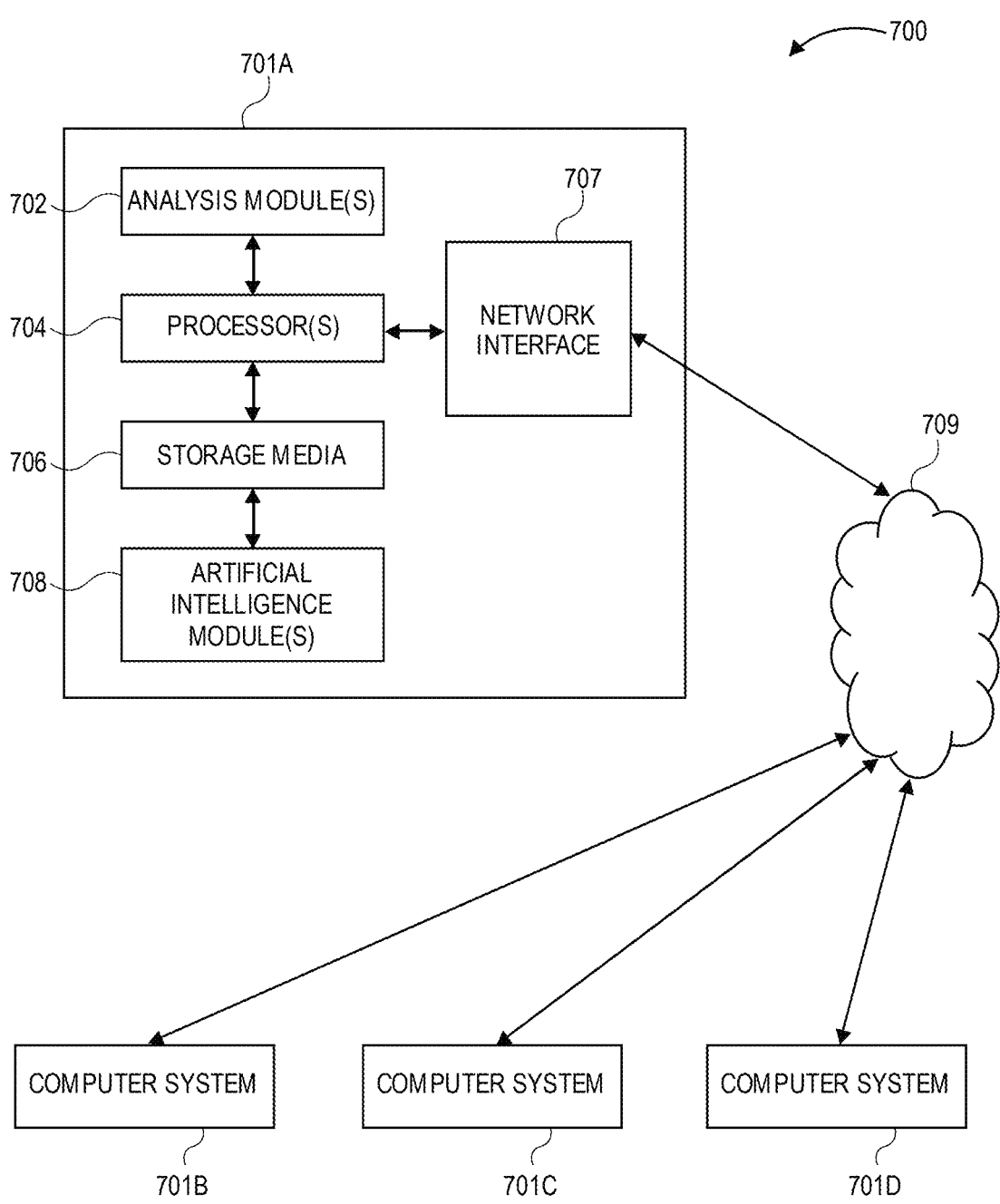
FIG. 7 illustrates a schematic view of a computing system for performing at least a portion of the method(s) described herein, according to an embodiment.

In some embodiments, the methods of the present disclosure may be executed by a computing system. FIG. 7 illustrates an example of such a computing system 700, in accordance with some embodiments. The computing system 700 may include a computer or computer system 701A, which may be an individual computer system 701A or an arrangement of distributed computer systems. The computer system 701A includes one or more analysis modules 702 that are configured to perform various tasks according to some embodiments, such as one or more methods disclosed herein. To perform these various tasks, the analysis module 702 executes independently, or in coordination with, one or more processors 704, which is (or are) connected to one or more storage media 706 which is (or are) connected to an artificial intelligence module 708. The processor(s) 704 is (or are) also connected to a network interface 707 to allow the computer system 701A to communicate over a data network 709 with one or more additional computer systems and/or computing systems, such as 701B, 701C, and/or 701D (note that computer systems 701B, 701C and/or 701D may or may not share the same architecture as computer system 701A, and may be located in different physical locations, e.g., computer systems 701A and 701B may be located in a processing facility, while in communication with one or more computer systems such as 701C and/or 701D that are located in one or more data centers, and/or located in varying countries on different continents).

A processor may include a microprocessor, microcontroller, processor module or subsystem, programmable integrated circuit, programmable gate array, or another control or computing device.

The storage media 706 may be implemented as one or more computer-readable or machine-readable storage media. Note that while in the example embodiment of FIG. 7 storage media 706 is depicted as within computer system 701A, in some embodiments, storage media 706 may be distributed within and/or across multiple internal and/or external enclosures of computing system 701A and/or additional computing systems. Storage media 706 may include one or more different forms of memory including semiconductor memory devices such as dynamic or static random access memories (DRAMs or SRAMs), erasable and programmable read-only memories (EPROMs), electrically erasable and programmable read-only memories (EE-PROMs) and flash memories, magnetic disks such as fixed, floppy and removable disks, other magnetic media including tape, optical media such as compact disks (CDs) or digital video disks (DVDs), BLURAY® disks, or other types of optical storage, or other types of storage devices. Note that the instructions discussed above may be provided on one computer-readable or machine-readable storage medium, or may be provided on multiple computer-readable or machine-readable storage media distributed in a large system having possibly plural nodes. Such computer-readable or machine-readable storage medium or media is (are) considered to be part of an article (or article of manufacture). An article or article of manufacture may refer to any manufactured single component or multiple components. The storage medium or media may be located either in the machine running the machine-readable instructions, or located at a remote site from which machine-readable instructions may be downloaded over a network for execution.

It should be appreciated that computing system 700 is merely one example of a computing system, and that computing system 700 may have more or fewer components than shown, may combine additional components not depicted in the example embodiment of FIG. 7, and/or computing system 700 may have a different configuration or arrangement of the components depicted in FIG. 7. The various components shown in FIG. 7 may be implemented in hardware, software, or a combination of both hardware and software, including one or more signal processing and/or application specific integrated circuits.

Further, the steps in the processing methods described herein may be implemented by running one or more functional modules in information processing apparatus such as general purpose processors or application specific chips, such as ASICs, FPGAs, PLDs, or other appropriate devices. These modules, combinations of these modules, and/or their combination with general hardware are included within the scope of the present disclosure.

Computational interpretations, models, and/or other interpretation aids may be refined in an iterative fashion; this concept is applicable to the methods discussed herein. This may include use of feedback loops executed on an algorithmic basis, such as at a computing device (e.g., computing system 700, FIG. 7), and/or through manual control by a user who may make determinations regarding whether a given step, action, template, model, or set of curves has become sufficiently accurate for the evaluation of the risk index.

The steps in the processing methods described above may be implemented by running one or more functional modules in information processing apparatus such as general purpose processors or application specific chips, such as ASICs, FPGAs, PLDs, or other appropriate devices. These modules, combinations of these modules, and/or their combination with general hardware are included within the scope of this disclosure.

Of course, many processing techniques for collected data, including one or more of the techniques and methods disclosed herein, may also be used successfully with collected data types other than seismic or other subsurface modeling data. While certain implementations have been disclosed in the context of seismic or other subsurface data collection and processing, those with skill in the art will recognize that one or more of the methods, techniques, and computing systems disclosed herein can be applied in many fields and contexts where data involving structures arrayed in a multi-dimensional space and/or subsurface region of interest may be collected and processed, e.g., medical imaging techniques such as tomography, ultrasound, MRI and the like for human tissue; radar, sonar, and LIDAR imaging techniques; mining area surveying and monitoring, oceanographic surveying and monitoring, and other appropriate multi-dimensional imaging problems.

Some examples of equations and mathematical expressions may have been provided in this disclosure. But those with skill in the art will appreciate that variations of these expressions and equations, alternative forms of these expressions and equations, and related expressions and equations that can be derived from the example equations and expressions provided herein may also be successfully used to perform the methods, techniques, and workflows related to the embodiments disclosed herein.

The foregoing description, for purposes of explanation, has been described with reference to specific embodiments. However, the illustrative discussions above are not intended to be exhaustive or to limit the described embodiments to the precise forms disclosed. Many modifications and variations are possible in view of the above teachings. The embodiments were chosen and described in order to explain the principles of this disclosure and its practical applications, to thereby enable others skilled in the art to use the disclosed approach and various embodiments with various modifications as are suited to the particular use contemplated.

What is claimed is:

1. A method for optimizing an integrated network related to a wellsite, the method comprising:

inputting data related to the integrated network of the wellsite, wherein the integrated network comprises a plurality of wells;

simultaneously simulating:

a first flow within a first plurality of flowlines within the integrated network based on the data; and a second flow within a second plurality of flowlines within the integrated network based on the data;

wherein:

the second plurality of flowlines are disposed within the plurality of wells and configured to transport fluid from the plurality of wells; and the first plurality of flowlines is configured to distribute a gas from a source outside the plurality of wells to the plurality of wells;

determining a first output for the plurality of wells based on the simultaneously simulating the first flow and the second flow; and displaying the first output for each well of the plurality of wells on a screen.

2. The method of claim 1, wherein the inputting the data related to the integrated network comprises inputting a first set of parameters related to the plurality of wells within the integrated network and constructing a configuration of the integrated network on a graphical interface.

3. The method of claim 2, further comprising revising the data related to the integrated network to generate revised data.

4. The method of claim 3, wherein the revising the data related to the integrated network comprises at least one of inputting a second set of parameters related to the plurality of wells within the integrated network or adjusting the configuration of the integrated network on the graphical interface.

5. The method of claim 3, further comprising simultaneously simulating the first flow and the second flow based on the revised data.

6. The method of claim 5, further comprising determining a further output for the plurality of wells based on the simultaneously simulating the first flow and the second flow.

7. The method of claim 6, further comprising displaying the further output for each of the plurality of wells on the screen.

8. The method of claim 7, further comprising performing a site action based on at least one of the first output or the further output.

9. The method of claim 8, wherein:

performing the site action comprises generating or transmitting a signal that instructs or causes an action to occur;

the action comprises a physical action; and the physical action comprises at least one of adjusting a flow of fluid within a pipeline or a wellbore, varying an amount of the gas delivered into the wellbore from the first plurality of flowlines, varying a production amount from the wellbore, or reconfiguring the integrated network.

10. The method of claim 1, wherein the second plurality of flowlines are configured to transport the fluid from the plurality of wells to a sink within the integrated network.

11. The method of claim 1, wherein the gas comprises a lift-gas.

12. A computing system, comprising:

one or more processors; and a memory system comprising one or more non-transitory computer-readable media storing instructions that, when executed by at least one of the one or more processors, cause the computing system to perform operations, the operations comprising:

inputting data related to an integrated network of a wellsite, wherein the integrated network comprises a plurality of wells;

simultaneously simulating:

a first flow within a first plurality of flowlines within the integrated network based on the data; and a second flow within a second plurality of flowlines within the integrated network based on the data, wherein:

the second plurality of flowlines are disposed within the plurality of wells and configured to transport fluid from the plurality of wells; and the first plurality of flowlines is configured to distribute a gas from a source outside the plurality of wells to the plurality of wells;

determining a first output for the plurality of wells based on the simultaneously simulating the first flow and the second flow; and displaying the first output for each well of the plurality of wells on a screen.

13. The computing system of claim 12, further comprising:

revising the data related to the integrated network to generate revised data;

simultaneously simulating the first flow and the second flow based on the revised data;

determining a further output for the plurality of wells based on the simultaneously simulating the first flow and the second flow; and displaying the further output for each well of the plurality of wells on the screen.

14. The computing system of claim 13, wherein:

the inputting the data related to the integrated network comprises inputting a first set of parameters related to the plurality of wells within the integrated network, and the revising the data related to the integrated network comprises inputting a second set of parameters related to the plurality of wells within the integrated network.

15. The computing system of claim 14, wherein at least one of the inputting the first set of parameters or the inputting the second set of parameters comprises at least one of inputting a surface injection rate, a surface injection pressure, a surface injection temperature, or a minimum valve injection differential pressure.

16. The computing system of claim 13, wherein:

the inputting the data related to the integrated network comprises constructing a configuration of the integrated network on a graphical interface, and the revising the data related to the integrated network comprises adjusting the configuration of the integrated network on the graphical interface.

17. The computing system of claim 16, wherein at least one of the constructing the configuration of the integrated network on the graphical interface or the adjusting the configuration of the integrated network on the graphical interface comprises:

placing a location of the source and a sink on the graphical interface;

placing a location of at least one well of the plurality of wells on the graphical interface; and connecting the second plurality of flowlines between the at least one well of the plurality of wells and the sink on the graphical interface.

18. The computing system of claim 17, further comprising displaying a visual representation of the wellsite on the graphical interface.

19. The computing system of claim 13, further comprising performing a site action based on at least one of the first output or the further output, wherein:

performing the site action comprises generating or transmitting a signal that instructs or causes an action to occur, the action comprises a physical action, and the physical action comprises at least one of adjusting a flow of fluid within a pipeline or a wellbore, varying an amount of the gas delivered into the wellbore from the first plurality of flowlines, varying a production amount from the wellbore, or reconfiguring the integrated network.

20. A non-transitory computer-readable medium storing instructions that, when executed by one or more processors of a computing system, cause the computing system to perform operations, the operations comprising:

inputting data related to an integrated network of a wellsite, wherein the integrated network comprises a plurality of wells;

simultaneously simulating:

a first flow within a first plurality of flowlines within the integrated network based on the data; and a second flow within a second plurality of flowlines within the integrated network based on the data;

wherein:

the second plurality of flowlines are disposed within the plurality of wells and configured to transport fluid from the plurality of wells; and the first plurality of flowlines is configured to distribute
a gas from a source outside the plurality of wells to
the plurality of wells;
determining a first output for the plurality of wells based
on the simultaneously simulating the first flow and the
second flow; and
displaying the first output for each well of the plurality of
wells on a screen.

\* \* \* \* \*